(12) United States Patent
Sellars et al.

(10) Patent No.: US 7,151,342 B2
(45) Date of Patent: Dec. 19, 2006

(54) PROCESSES FOR REMOVING ORGANIC LAYERS AND ORGANIC ELECTRONIC DEVICES FORMED BY THE PROCESSES

(75) Inventors: Mark Jeffrey Sellars, Buellton, CA (US); Nugent Truong, Ventura, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 123 days.

(21) Appl. No.: 10/840,981

(22) Filed: May 7, 2004

(65) Prior Publication Data

US 2005/0248260 A1    Nov. 10, 2005

(51) Int. Cl.
*H01J 1/62* (2006.01)
*H01J 63/04* (2006.01)

(52) U.S. Cl. .................. 313/509; 313/504; 313/507; 313/506

(58) Field of Classification Search ............... 313/507, 313/504, 506, 509
See application file for complete search history.

(56) References Cited

U.S. PATENT DOCUMENTS

| | | | |
|---|---|---|---|
| 5,814,417 A | 9/1998 | Nagayama | |
| 6,037,190 A | 3/2000 | Chao et al. | |
| 6,091,196 A * | 7/2000 | Codama | 313/504 |
| 6,111,357 A * | 8/2000 | Fleming et al. | 313/509 |
| 6,136,622 A * | 10/2000 | Fukuzawa et al. | 313/506 |
| 6,195,142 B1 | 2/2001 | Gyotoku et al. | |
| 6,626,721 B1 * | 9/2003 | Van Slyke | 313/504 |
| 6,656,611 B1 * | 12/2003 | Tai et al. | 313/509 |
| 6,717,357 B1 * | 4/2004 | Okuyama et al. | 313/504 |
| 2001/0004190 A1 * | 6/2001 | Nishi et al. | 313/506 |
| 2001/0054868 A1 * | 12/2001 | Okuyama et al. | 313/504 |
| 2002/0021089 A1 * | 2/2002 | Kim | 313/506 |
| 2002/0110673 A1 | 8/2002 | Heydarpour et al. | |
| 2004/0096697 A1 * | 5/2004 | Tai et al. | 313/506 |
| 2005/0082966 A1 * | 4/2005 | Yamazaki et al. | 313/498 |
| 2005/0248270 A1 * | 11/2005 | Ghosh et al. | 313/512 |

* cited by examiner

*Primary Examiner*—Nimeshkumar D. Patel
*Assistant Examiner*—Peter Macchiarolo
(74) *Attorney, Agent, or Firm*—John H. Lamming

(57) ABSTRACT

A process for protecting first electrodes, conductive leads and the underlying substrate from the process of removing organic layers during the fabrication of an organic electronic device. After first electrodes and conductive leads are formed over a substrate, a protective layer is selectively formed over the structure, with the protective layer not being disposed over selected portions of the first electrodes, the conductive leads and the substrate. Organic layers are then formed over the structure, and second electrodes are formed over the organic layers. Those portions of the organic layers disposed over the selected portions of the first electrodes, conductive leads and substrate are removed, and the protective layer protects adjacent portions of the first electrodes, conductive leads and substrate from the process of removing the portions of the organic layers.

9 Claims, 9 Drawing Sheets

PROCESSES FOR REMOVING ORGANIC LAYERS AND ORGANIC ELECTRONIC DEVICES FORMED BY THE PROCESSES

STATEMENT AS TO FEDERALLY SPONSORED RESEARCH

This invention was made with Government support under DARPA grant number 4332. The Government may have certain rights in the invention.

FIELD OF THE INVENTION

The invention relates generally to organic electronic devices, and more particularly to processes for selectively removing organic layers from portions of the device during fabrication of an organic electronic device and organic electronic devices formed by the processes.

BACKGROUND INFORMATION

For organic light emitting diode (OLED) devices, the laser ablation process has been used to remove organic films from unwanted areas of the device substrate. The first steps in the fabrication of OLED devices are the growth and patterning of the anode and leads films. The anode film is typically indium tin oxide (ITO), and the leads may include a tri-layer sandwich including an adhesion layer and a low-resistivity conducting layer. A typical lead structure is Cr/Cu/Cr. After forming the patterned anode and lead layers, the process involves patterning photoresist cathode separation lines followed by the coating of two or more organic layers, called the charge transport layer(s) and the electroluminescent layer(s), over the entire substrate using a liquid deposition technique. The substrate then goes into the laser ablation system, where the laser beam is focused onto areas that need to be cleared of the organic layers. These include the cathode-to-leads electrical contact pads, bond pads, and the frame (sometimes called rail) around the active area upon which glue is dispensed for the encapsulating lid.

It has been found that the laser ablation process can crack or otherwise damage the lead structure. Moreover, if a plastic substrate is used, the laser ablation process also can damage the moisture and oxygen barrier layer that is part of the substrate. It has also been found that corrosion of the leads can occur in the finished organic electronic device. Lastly, it can be difficult to adequately remove the organic layers over the leads to provide good electrical contact, as well as safely remove the organic layers over the barrier layer at the rail so that the finished organic electronic device can be properly sealed.

SUMMARY OF THE INVENTION

A process has been developed to safely remove organic layers during fabrication of organic electronic devices. It has also been discovered that this process protects conductive leads from corrosion.

In one aspect of the present invention, an electronic device comprises at least one first electrode disposed over a substrate, at least one conductive lead disposed over the substrate and laterally spaced apart from the at least one first electrode, a protective layer of material selectively disposed over the at least one first electrode and the at least one conductive lead, wherein the protective layer is not disposed over one or more selected portions of the at least one first electrode and the at least one conductive lead, organic active material selectively disposed over the protective layer, wherein the organic active material is not disposed over at least part of the one or more selected portions, and at least one second electrode disposed over the organic material.

In another aspect of the present invention, a process for forming an electronic device comprises forming at least one first electrode over a substrate, forming at least one conductive lead over the substrate, wherein the at least one conductive lead is laterally spaced apart from the at least one first electrode, forming a protective layer of material over portions of the at least one first electrode and the at least one conductive lead, wherein one or more selected portions of the at least one first electrode and the at least one conductive lead are left exposed by the protective layer, forming organic material over the protective layer and the one or more selected portions, forming at least one second electrode over the organic material, and removing portions of the organic material to at least partially expose the one or more selected portions.

Other features and advantages of the invention will be apparent from the following detailed description, and from the claims. The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
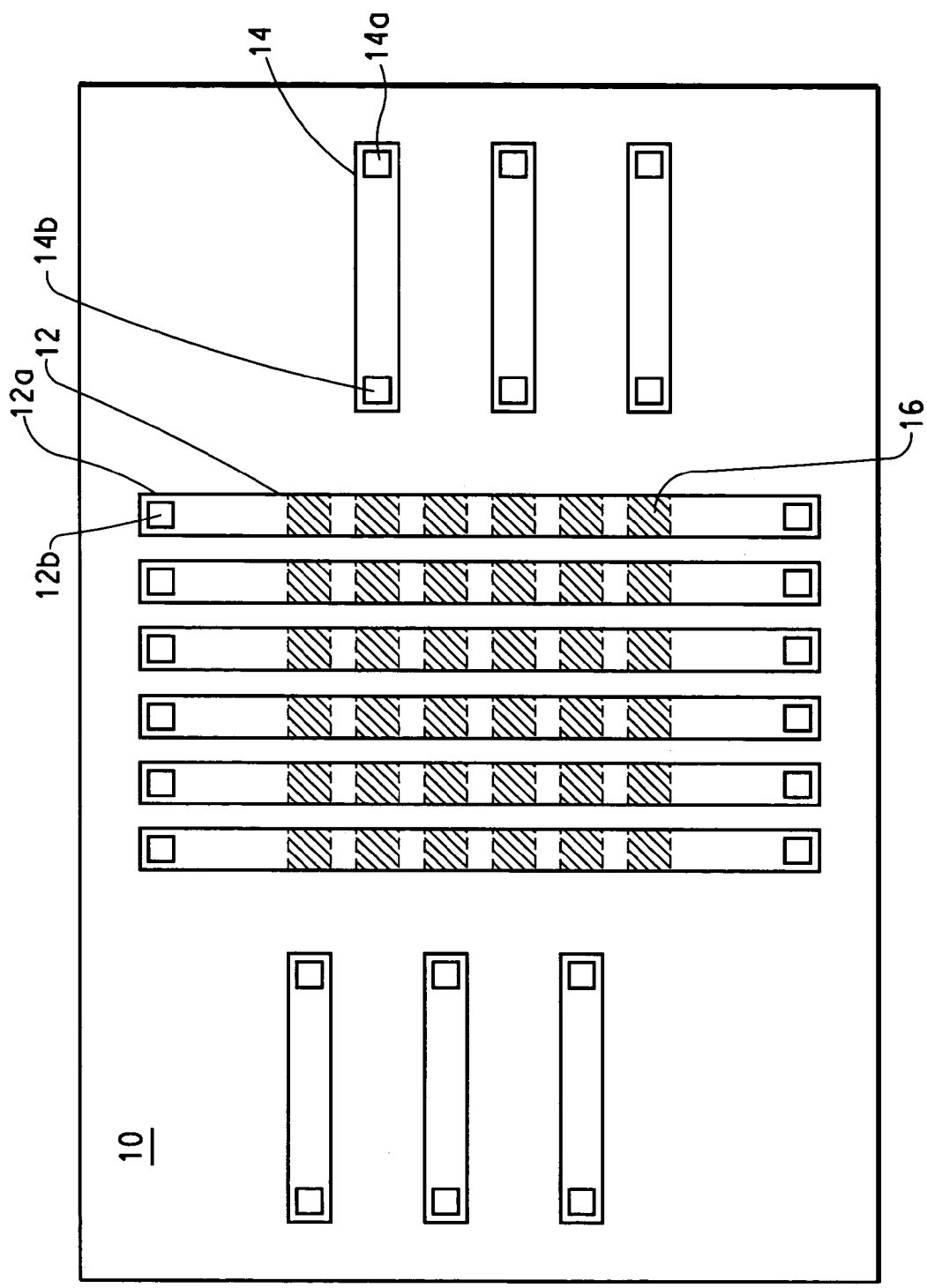
FIG. 1 is a plan view of a portion of a structure of the present invention, after forming anode strips and conductive leads on a substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Reference is now made in detail to the exemplary embodiment(s) of the invention, examples of which are illustrated in the accompanying drawings. Wherever possible, the same reference numbers will be used throughout the drawings to refer to the same or like parts (elements).

A process has been developed to protect the leads and barrier layer when portions of organic layer(s) are removed (e.g. via laser ablation, plasma etching, or combinations thereof during the fabrication of an organic electronic device. The process safely removes the organic layer(s) over portions of the conductive leads and wire bond pads for making an electrical connection, and over portions of the barrier layer at the device rail (used for glue dispensing for encapsulation) to reduce the likelihood that contaminants will enter the device and significantly reduce its operating lifetime.

The process results in an electronic device having at least one first electrode disposed over a substrate, at least one conductive lead disposed over the substrate and laterally spaced apart from the at least one first electrode, a protective layer of material selectively disposed over the at least one first electrode and the at least one conductive lead, wherein the protective layer is not disposed over one or more selected portions of the at least one first electrode and the at least one conductive lead, an organic active material selectively disposed over the protective layer, wherein the organic active material is not disposed over at least part of the one or more selected portions, and at least one second electrode disposed over the organic material.

Before addressing details of embodiments described below, some terms are defined or clarified. Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

As used herein, the terms "array," "peripheral circuitry" and "remote circuitry" are intended to mean different areas or components. For example, an array may include a number of pixels, cells, or other electronic devices within an orderly arrangement (usually designated by columns and rows) within a component. These electronic devices may be controlled locally on the component by peripheral circuitry, which may lie within the same component as the array but outside the array itself. Remote circuitry typically lies away from the peripheral circuitry and can send signals to or receive signals from the array (typically via the peripheral circuitry). The remote circuitry may also perform functions unrelated to the array.

The term "active" when referring to a layer or material is intended to mean a layer or material that exhibits electro-radiative or electromagnetic properties. An active layer material may emit radiation or exhibit a change in concentration of electron-hole pairs when receiving radiation.

The term organic electronic devices includes, but is not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode).

Also as used herein, the terms "over" and "on" both inclusively include "directly on" (no intermediate materials or elements disposed therebetween) and "indirectly on" (intermediate materials or elements disposed therebetween). For example, forming an element "over a substrate" can include forming the element directly on the substrate with no intermediate materials/elements therebetween, as well as forming the element indirectly on the substrate with one or more intermediate materials/elements therebetween.

The term "electron withdrawing" is synonymous with "hole injecting." Literally, holes represent a lack of electrons and are typically formed by removing electrons, thereby creating an illusion that positive charge carriers, called holes, are being created or injected. The holes migrate by a shift of electrons, so that an area with a lack of electrons is filled with electrons from an adjacent layer, which give the appearance that the holes are moving to that adjacent area. For simplicity, the terms holes, hole injecting, hole transport, and their variants will be used.

The term "low work function material" is intended to mean a material having a work function no greater than about 4.4 eV. The term "high work function material" is intended to mean a material having a work function of at least approximately 4.4 eV.

Group numbers corresponding to columns within the periodic table of the elements use the "New Notation" convention as seen in the *CRC Handbook of Chemistry and Physics*, $81^{st}$ Edition (2000).

To the extent not described herein, many details regarding specific materials, processing acts, and circuits are conventional and may be found in textbooks and other sources within the organic light-emitting diode display, photo detector, and semiconductor arts.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The term "layer" or "film" refers to a coating covering a desired area. The area can be as large as an entire device or as small as a specific functional area such as the actual visual display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing. A "layer" of a material shall include single or multiple layers of such material.

The term "protective layer of material" shall mean one or more layers of material(s) used to protect underlying materials or structures from subsequent processing steps and/or from contamination both during and after fabrication.

Attention is now directed to FIGS. 1–11C, which show the processing steps for making a monochromatic passive matrix OLED display according to one illustrative embodiment of the present invention. Modifications that may be made for use with multi-color or full-color passive matrix and active matrix OLED displays are described later in this specification.

FIG. 1 includes a plan view of a portion of a substrate 10. The substrate 10 can include nearly any type and number of materials including conductive, semiconductive, or insulating materials. If substrate 10 includes a conductive base material, care may need to be exercised to ensure the proper electrical isolation between parts of a component. The conductive base material may be covered by an insulating layer having a sufficient thickness to reduce the effects of parasitic capacitance between overlying electrodes or conductors and the underlying conductive base material. Skilled artisans are capable of determining an appropriate thickness of an insulating layer to reduce the effects of undesired capacitive coupling.

The substrate 10 may comprise a rigid material (e.g., glass, alumina, or the like) or a flexible material comprising at least one polymeric film. Examples of suitable polymers for the polymeric film may be selected from one or more materials containing essentially polyolefins (e.g., polyethylene, polypropylene, or the like); polyesters (e.g., polyethylene terephthalate, polyethylene naphthalate or the like); polyimides; polyamides; polyacrylonitriles and polymethacrylonitriles; perfluorinated and partially fluorinated polymers (e.g., polytetrafluoroethylene, copolymers of tetrafluoroethylene and polystyrenes, and the like); polycarbonates; polyvinyl chlorides; polyurethanes; polyacrylic resins, including homopolymers and copolymers of esters of acrylic or methacrylic acids; epoxy resins; Novolac resins; any combination thereof; and the like. When multiple films are used, they can be joined together with appropriate adhesives or by conventional layer producing processes including known coating, co-extrusion, or other similar processes. The polymeric films generally have a thickness in the range of approximately 12–250 microns. When more than one film layer is present, the individual thicknesses can be much less.

Although the polymeric film(s) may contain essentially one or more of the polymers described above, the film(s) may also include one or more conventional additive(s). For example, many commercially available polymeric films contain slip agents or matte agents to prevent the layers of film from sticking together when stored as a large roll.

If a polymeric substrate is used, a barrier layer may be formed over its top surface to prevent contamination thereto. For flexible substrates that include a plurality of polymeric films, at least one layer of barrier material may be sandwiched between at least two of the polymeric films. In one non-limiting example, a polyester film approximately 25–50 microns thick can be coated with an approximately 2–500 nm thick layer of silicon nitride ($SiN_x$) using plasma enhanced chemical vapor deposition or physical vapor deposition (conventional Radio-Frequency (RF) magnetron sputtering or inductively-coupled plasma physical vapor deposition (ICP-PVD). The silicon nitride layer can then be overcoated with a solution of acrylic resin that is allowed to dry, or an epoxy or Novolac resin followed by curing. Alternatively, the silicon nitride coated polyester film can be laminated to a second layer of polyester film. The overall thickness of the composite structure is generally in the range of approximately 12–250 microns, and more typically 25–200 microns. Such overall thickness can be affected by the method used to apply or lay down the composite structure.

After reading this specification, skilled artisans appreciate that the selection of material(s) that can be used for the substrate 10 is widely varied. Skilled artisans are capable of selecting the appropriate material(s) based on their physical, chemical, and electrical properties. For simplicity, the preferred embodiment described below uses a flexible substrate generally referred to as substrate 10, which includes one or more polymeric layers covered by a barrier layer.

A first electrode layer is formed over the substrate 10, and can include nearly any conductive material. In this illustrative example of one embodiment, the electrode layer will eventually form the anodes for the electronic devices that are being formed. The first electrode layer can actually be plurality of conductive layers. In an exemplary embodiment, the first electrode layer can be indium tin oxide, with a thickness in a range of approximately 100–200 nm.

The first electrode layer is then patterned using any conventional patterning technique (e.g. photolithography) to form spaced apart anode strips 12 of the first electrode layer material, as shown in FIG. 1. Alternately, the anode strips 12 may be formed using a shadow mask, whereby the first electrode layer is initially deposited in strips 12, and a separate patterning step is then unnecessary. Anode strips 12 constitute first electrodes for the organic electronic device.

In the embodiment shown in FIG. 1, each anode strip 12 terminates with an integrally formed anode lead portion 12a. The anode lead portions 12a include bonding pad areas 12b to which wires (i.e. from peripheral and/or remote circuitry) can be connected. It should be noted that anode lead portions 12a can alternatively be physically separated from the rest of anode strips 12, whereby separately formed conductive members (not shown) can connect anode leads/strips 12a/12 together.

Note that FIG. 1 illustrates only a simplified portion of an array of the electronic devices, without showing the peripheral and remote circuitry areas of the substrate. Actual arrays typically include many more pixels and are more elaborate, but a smaller and simplified array portion is shown to better illustrate the invention. The array may include a plurality of electronic devices for a display (e.g., an electroluminescent display), a radiation detector (e.g., a photo detector), a voltaic cell (e.g., a photovoltaic cell), or the like.

Conductive leads 14 are formed to provide electrical connections between the second electrode layer and peripheral and remote circuitry. In this illustrative example of one embodiment, the second electrode layer is a cathode layer. As shown in FIG. 1, the conductive leads 14 are located near the sides of the array. The anode strips 12 and conductive leads 14 are spaced apart from one another. The conductive leads 14 may be formed using any conventional technique and may comprise one or more layers of chromium, aluminum, molybdenum, copper, alloys thereof, and potentially other metals and alloys, as well as adhesion layer(s). In one embodiment, the conductive leads 14 may comprise a plurality of layers including Cr/Al/Cr, Cr/Cu/Cr, or Mo/Cu/Mo, however other metals or combinations of layers may be used. The thickness of the conductive leads 14 can be in a range of approximately 10–600 nm. Note that the order in which the conductive leads 14 and anode strips 12 are formed may be reversed in some embodiments.

Figure 2:
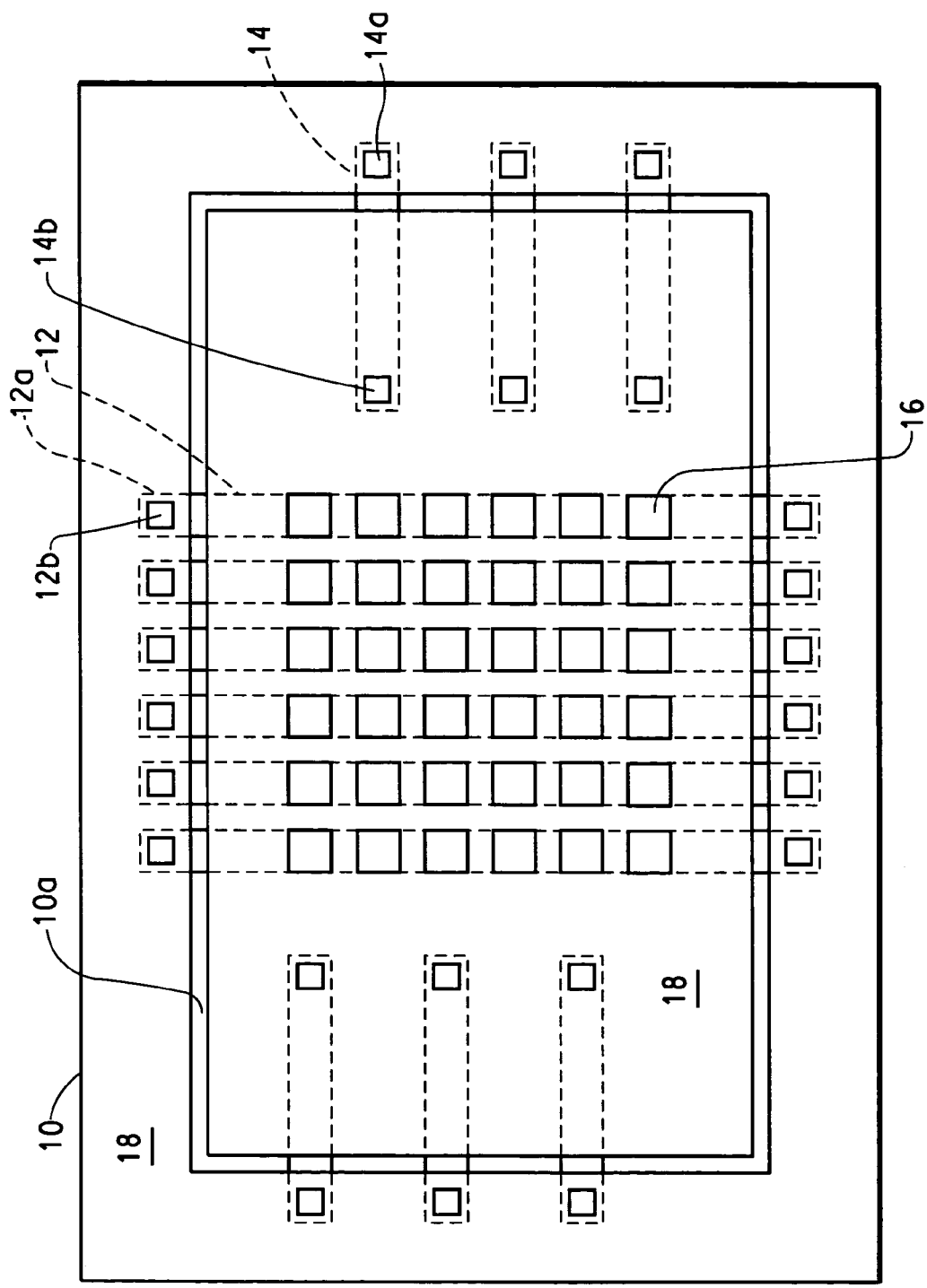
FIG. 2 is a plan view of the structure of FIG. 1, after forming a protective layer over selective portions thereof.

As shown in FIG. 2, a protective layer 18 is next formed over select areas of the anode strips 12, the conductive leads 14 and the exposed portions of substrate 10. This protective layer 18 serves to protect these select areas from later processing and from outside contamination that can cause corrosion or degradation. Protective layer 18 may, but not necessarily, be formed of insulating material(s), since it may be formed directly on conductive anode strips 12 and conductive leads 14. The protective layer 18 may comprise single or multiple layers of metal oxide or metal nitride insulating materials (e.g., silicon nitride, silicon oxide, aluminum nitride, aluminum oxide, or combinations thereof), as well as mixtures thereof.

The selected areas on which the protective layer 18 is formed may include the anode strips 12 and the conductive leads 14, but may not include wire bonding pad areas 12b and 14a at the distal ends thereof (that will later serve as the electrical connection to the peripheral/remote circuitry), and conductive lead via areas 14b at the proximate ends of the conductive leads 14 adjacent the array (that will later serve as the electrical connection to the second electrode members).

While the protective layer 18 can be formed using one of several conventional techniques (e.g. deposition followed by photolithographic etch, etc.), a lift-off stencil process is may be used to avoid wet chemistry that can damage the existing structure. This process is well known in the art, and begins by forming image reversal photoresist only over those portions of the structure on which the protective layer 18 is not to be formed, preferably with a wedge-shaped cross-sectional profile (i.e. undercut). Then, the protective material is formed over the structure, followed by a photoresist strip process that removes the image reversal photoresist along with the protective layer portions directly over the photoresist.

For one embodiment of the present invention, a layer of image reversal photoresist is formed over the structure shown in FIG. 1 by a conventional deposition process. A photolithographic exposure and dry etch process follows, which removes the photoresist material except for portions over the wire bonding pad areas 12b and 14a, the conductive lead via areas 14b, a rail portion 10a of the substrate, and (for reasons described later) the eventual pixel portions 16 of anode strips 12 (so that thin strips of the protective layer 18 will remain in the finished device between the pixel portions 16). Rail portion 10a is a (rectangular) strip that encircles the anode strip pixel portions 16, but not the wire bonding pad areas 12b and 14a (see FIG. 2).

The protective layer 18 is then formed over the structure using a conventional deposition process (e.g. silicon nitride formed via vacuum deposition with a thickness of about 1000 Å). A photoresist strip process is then used to remove the remaining portions of the photoresist (and the portions of protective layer 18 over that photoresist), so that the protective layer 18 covers the structure except the wire bonding pad areas 12b and 14a, the cathode via areas 14b, the rail portion 10a of the substrate 10, and the pixel portions 16 of anode strips 12, as shown in FIG. 2. Other selected areas of the structure can also be chosen to be left exposed by this protective layer formation process.

While the protective layer 18 could be removed from the entire pixel area of the array structure, protective material is left remaining between the pixel portions 16 in an exemplary embodiment of the present invention for at least two reasons. First, it can be difficult using a lift-off stencil process to remove a solid block of material that is the size of the entire array structure. Removing protective material just over each of the pixel portions 16 is more reliable. Second, the protective material left remaining between the pixel portions 16 can help reduce pixel shrinkage, as explained later in this specification.

Figure 3:
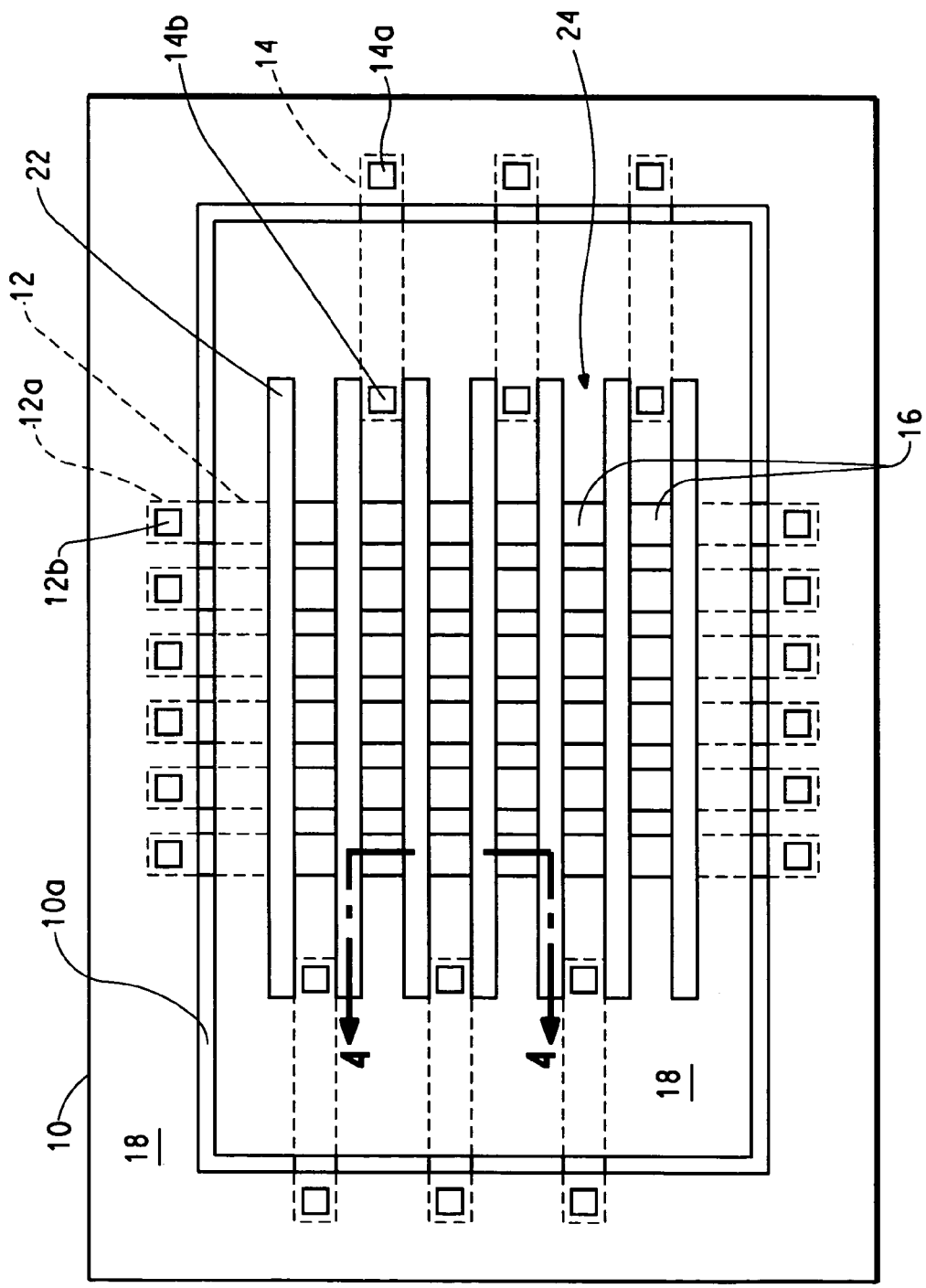
FIG. 3 is a plan view of the structure of FIG. 2, after forming cathode separation strips thereon.

Cathode separation strips 22 are next formed by spin coating an insulating material to a thickness of approximately 2–5 µm over the structure, and then patterning the insulating material to form parallel, spaced apart strips 22 thereof extending across (and orthogonally to) the anode strips 12, as illustrated in FIG. 3. The cathode separation strips 22 extend beyond the anode strips 12, and along both sides of each conductive lead 14. The cathode separation strips 22 are separated by openings 24 in which portions of the anode strips 12, substrate 10 and conductive leads 14 are left exposed therein. It is in these openings 24 in which the cathodes and conductive bridge members will later be formed. The peripheral and remote circuitry areas of the substrate are not covered by the cathode separation strips 22.

Figure 4:
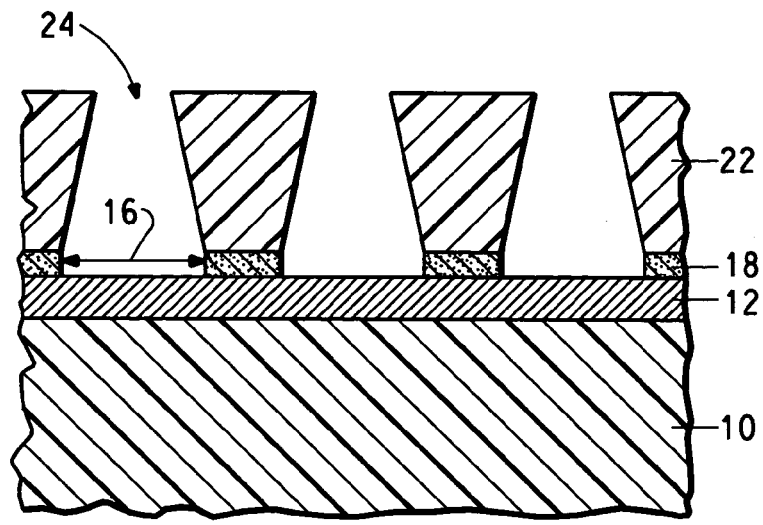
FIG. 4 is a cross-sectional view of the structure of FIG. 3 at sectioning lines 4—4.

The cathode separation strips 22 may comprise a photoimageable material including photoresist, polyimide, or the like. In one embodiment, a Novolac positive photoimageable photoresist with image reversal capability may be used. The cathode separation strips 22 may have a wedge shaped cross section, and are formed directly over the strips of protective layer 18 that are disposed between the pixel portions 16, as shown in FIG. 4.

Figure 5:
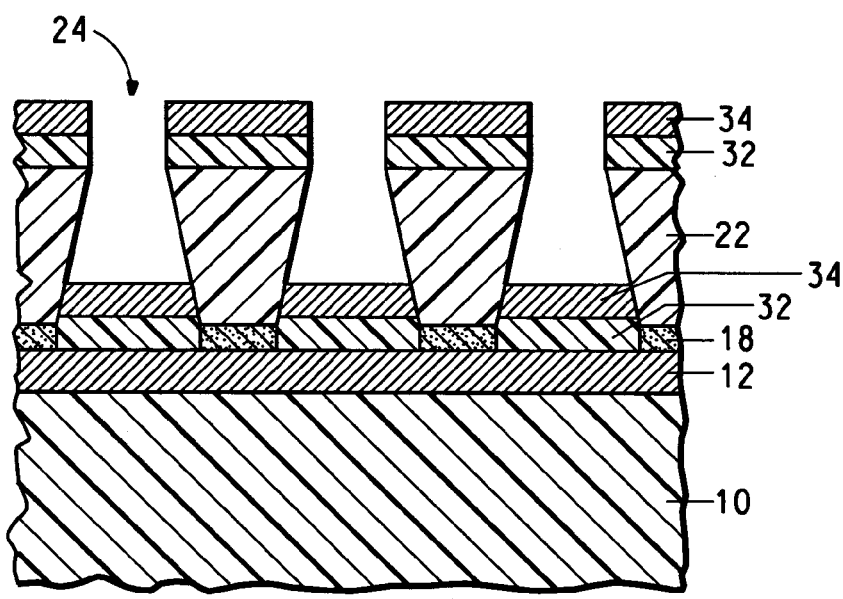
FIG. 5 is a cross-sectional view of the structure of FIG. 4, after forming a hole-transport layer and an organic active layer thereon.

An optional hole-transport layer 32 and a layer of organic active material 34 are next formed sequentially over the structure, as shown in FIG. 5. Layers 32 and 34 may be formed by spin coating appropriate materials as described below. One or both of the layers may be cured after spin coating. The layers 32 and 34 overlie the tops of the cathode separation strips 22 and along the bottoms of openings 24 between the cathode separation strips 22. Although not shown in FIG. 5, very thin portions of layers 32 and 34 may lie along the sides of the cathode separation strips 22 at locations above layer 34 within the openings 24. Note that the structures for the cathode separation strips 22 are narrower near the substrate 10 and wider further from the substrate 10. In another embodiment, the structures may have a more rounded cusp-like shape. The significance of the structures is addressed later in this specification.

The hole-transport layer 32 is an example of a charge transport layer. The hole-transport layer 32 can be used to reduce the amount of damage and potentially increase the lifetime and reliability of the device compared to a device where the anode strips 12 would directly contact a subsequently formed organic active layer. In one specific embodiment, the hole-transport layer 32 can include an organic polymer, such as polyaniline (PANI), poly(3,4-ethylenedioxythiophene) (PEDOT), and the like, or an organic charge transfer compound, such as tetrathiafulvalene tetracyanoquinodimethane (TTF-TCQN) and the like. Layer 32 typically has a thickness in a range of approximately 100–250 nm.

The hole-transport layer 32 typically is conductive to allow electrons to be removed from the subsequently formed active region and transferred to the conductive anode strips 12. Although the conductive strips 12 and the optional hole-transport layer 32 are both conductive, typically the conductivity of the anode strips 12 is significantly greater than that of the hole-transport layer 32.

Depending upon the application of the electronic device, the organic active layer 34 can be a radiation-emitting layer that is activated by a signal (such as in a light-emitting diode), or a layer of material that responds to radiant energy and generates a signal with or without an applied potential (such as in a photodetector). Examples of electronic devices that may respond to radiant energy include photoconductive cells, photoresistors, photoswitches, phototransistors, phototubes, and photovoltaic cells. After reading the specification, skilled artisans will appreciate that other similar electronic devices may operate outside the visible light spectrum, such as infrared, ultraviolet, and the like.

When the organic active layer 34 is within a radiation-emitting electronic device, the layer will emit radiation when sufficient bias voltage is applied to the electrical contact layers. The radiation-emitting organic active layer may contain nearly any organic electroluminescent or other organic radiation-emitting materials.

The organic active layer 34 can include any organic electroluminescent (EL) material including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato) aluminum ($Alq_3$); cyclometalated iridium and platinum electroluminescent compounds, such as complexes of Iridium with phenylpyridine, phenylquinoline, or phenylpyrimidine ligands as disclosed in Published PCT Application WO 02/02714, and organometallic complexes described in, for example, published applications U.S. 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00170655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof. The organic active layer 34 in a radiation-emitting device generally has a thickness in the range of approximately 40–100 nm.

When the organic active layer 34 is incorporated in a radiation detector or current generator, the layer responds to radiant energy and produces a signal or current either with or without a biased voltage. Materials that respond to radiant energy and are capable of generating a signal or current with a biased voltage (such as in the case of photoconductive cells, photoresistors, photoswitches, photodetectors, phototransistors, and phototubes) include, for example, many conjugated polymers and electroluminescent materials. Materials that respond to radiant energy and are capable of generating a signal or current without a biased voltage (such as in the case of a photoconductive cell or a photovoltaic cell) include materials that react to radiation and generate electron-hole pairs. The electrons or holes can be used in generating a signal or current. Such radiation-sensitive charge generating materials include for example, many conjugated polymers and electroluminescent and photoluminescent materials. Specific examples include, but are not limited to, poly(2-methoxy,5-(2-ethyl-hexyloxy)-1,4-phenylene vinylene) ("MEH-PPV") and MEH-PPV composites with CN-PPV. The organic active layer 34 in a radiation detector or current generator device typically has a thickness in a range of approximately 50–500 nm.

Although not shown, an optional electron-transport layer may be formed over the organic active layer 34. The electron-transport layer is another example of a charge transport layer. The electron-transport layer typically is conductive to allow electrons to be injected from the subsequently formed cathode and transferred to the organic active layer 34. Although the subsequently formed cathode and the optional electron-transport layer are both conductive, typically the conductivity of the cathode is significantly greater than that of the electron-transport layer.

In one specific embodiment, the electron-transport layer can include metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenyl)-5-(4-t-butylphenyl)-1,3,4-oxadiazole ("PBD" or the like), 3-(4-biphenyl)$_4$-phenyl-5-(4-t-butylphenyl)-1,2,4-triazole ("TAZ" or the like); other similar compounds; or any one or more combinations thereof. Alternatively, optional electron-transport layer may be inorganic and comprise BaO, LiF, $Li_2O$, or the like. The electron-transport layer typically has a thickness in a range of approximately 30–500 nm.

Figure 6:
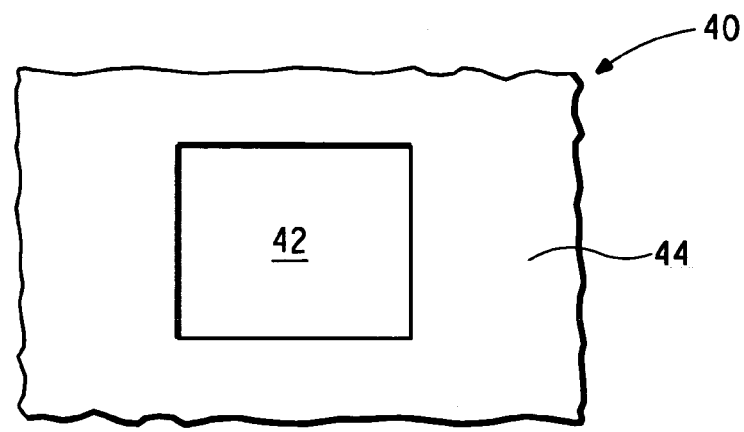
FIG. 6 is a top view of a shadow mask used for forming cathode material on the structure.
Figure 7:
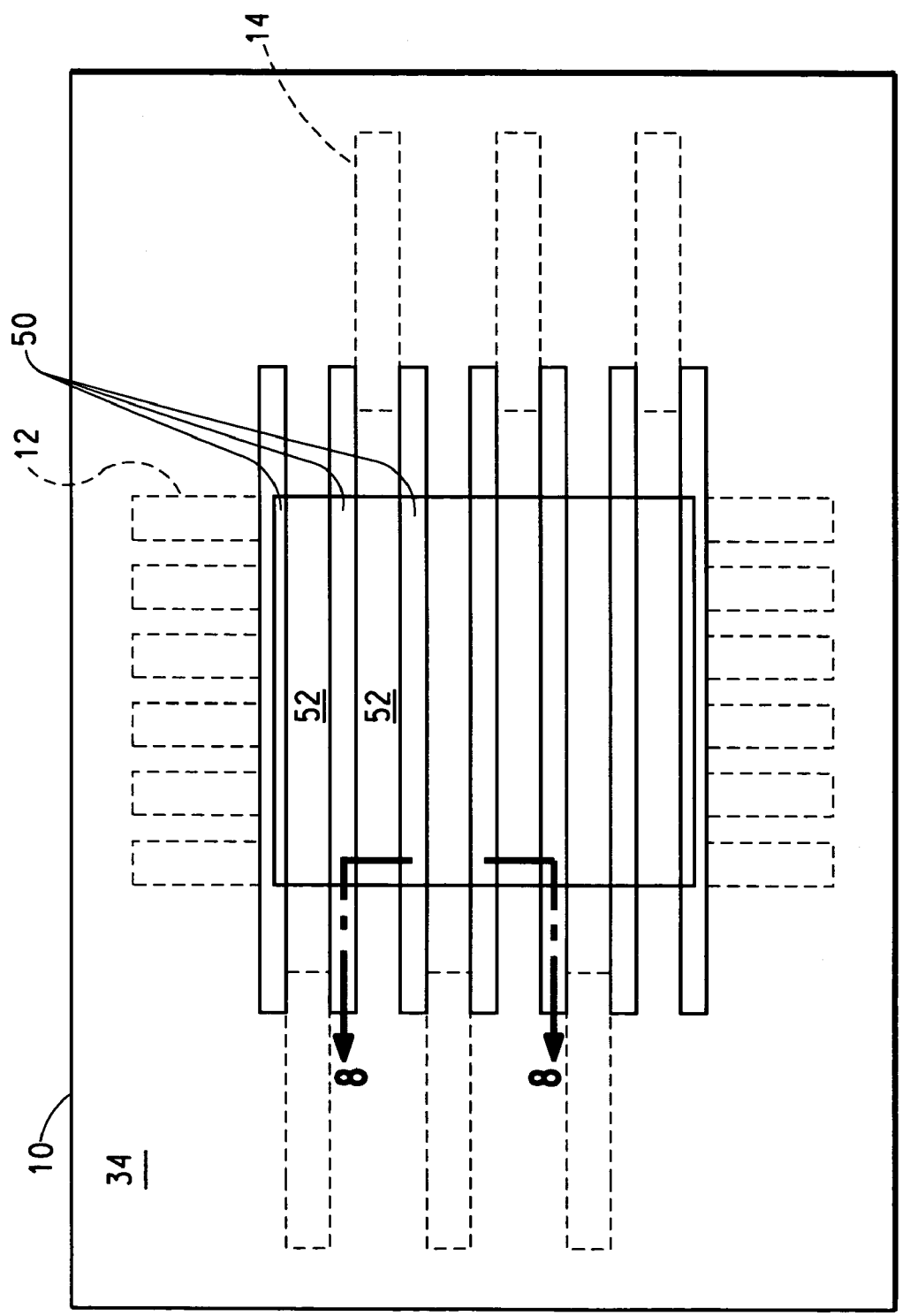
FIG. 7 is a plan view of the structure of FIG. 5, after forming the cathode material thereon.
Figure 8:
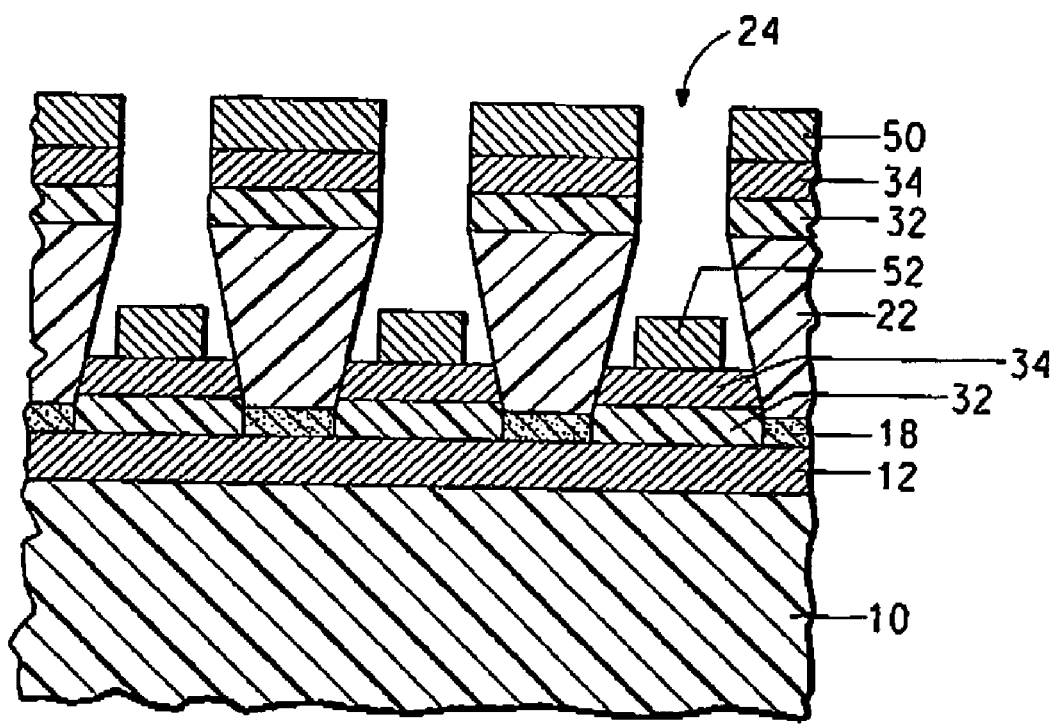
FIG. 8 is a cross-sectional view of the structure of FIG. 7 at sectioning lines 8—8.

Next, the second electrode (cathode) layer may be formed on the structure in the following manner. Portions of the structure are masked, using a first shadow mask 40 having a central cathode opening 42 surrounded by solid material 44, as shown in FIG. 6. The first shadow mask 40 is placed over the structure leaving a center portion of the array exposed via the cathode opening 42 and covering the rest of the structure with the solid portion 44 of the mask. Cathode material is then deposited on the exposed portion(s) of the structure (through cathode opening 42) by vapor deposition (e.g., evaporation, sputtering, or the like). Portions of the deposited cathode material are formed overlying the cathode separation strips 22 to form elongated conductive members 50, and on those portions of organic material 34 in openings 24 to form elongated cathode members 52, as shown in FIGS. 7 and 8. Due to the directional nature of the physical vapor deposition and the shape of the cathode separation strips 22, cathode members 52 are not electrically connected to one another or to conductive members 50. If the walls of the cathode separation strips 22 become closer to vertical, an optional collimator may be used during deposition to reduce the likelihood of an unintended electrical short between any of the cathode members 52 and the conductive members 50.

In general, the cathode material is deposited as one or more metal-containing layers of material having a low work function (i.e. lower than that of anode strips 12). Materials for the cathode material can be selected from Group 1 metals (e.g., Li, Cs, or the like), the Group 2 (alkaline earth) metals, the rare earth metals including the lanthanides and the actinides, and the like. The cathode material is generally deposited with a thickness in a range of approximately 300–500 nm. In one specific, non-limiting embodiment, the cathode material is a barium layer of less than approximately 10 nm followed by an aluminum layer of approximately 500 nm. Cathode members 52 constitute second electrodes for the organic electronic device.

Figure 9:
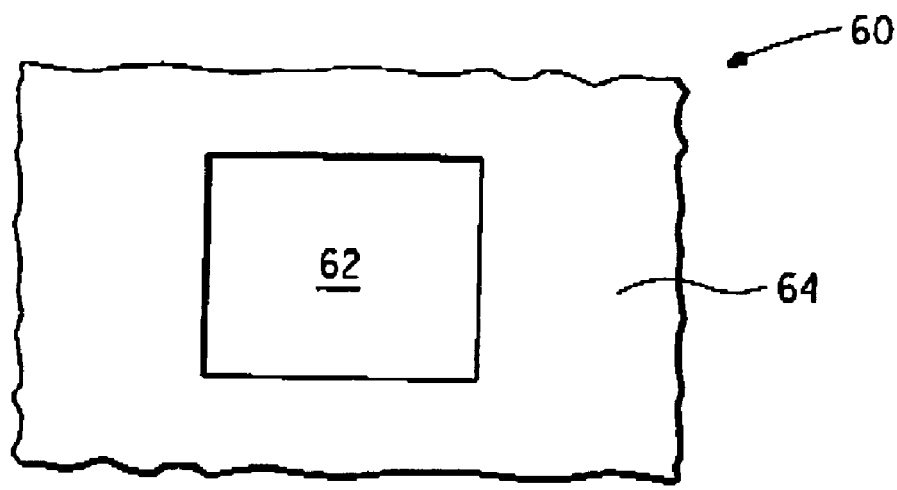
FIG. 9 is a view of a shadow mask used for forming bridge material on the structure.

After the shadow mask 40 is removed, those selected portions of organic active layer 34 and hole transport layer 32 overlying the wire bonding pad areas 12b and 14a, the cathode via areas 14b, and the substrate rail 10a are removed by, for example, laser ablation, as illustrated in FIG. 9. The laser ablation process includes focusing a laser beam on those selected portions of the structure from which layers 32/34 are to be removed, where the laser ablation parameters are set such that the laser beam ablates away layers 32/34 without penetrating any portions of protective layer 18. Thus, even if there is over-ablation (laser energy applied to non-selected portions of the structure), only those portions of the anode strips 12, conductive leads 14, and rail portions 10a of the substrate 10 that were left exposed by the formation of protective layer 18 are left exposed now. The areas of the structure adjacent thereto are protected from the laser energy by the protective layer 18.

Alternately, the selected portions of organic active layer 34 and hole transport layer 32 described above could be removed by a plasma etch process instead of by laser ablation, where protective layer 18 would serve to protect non-selected portions of the structure from this etch process. An exemplary plasma etch process is described in co-pending U.S. patent application Ser. No. 10/625,112 filed on Jul. 22, 2003, which is incorporated herein by reference.

Figure 10:
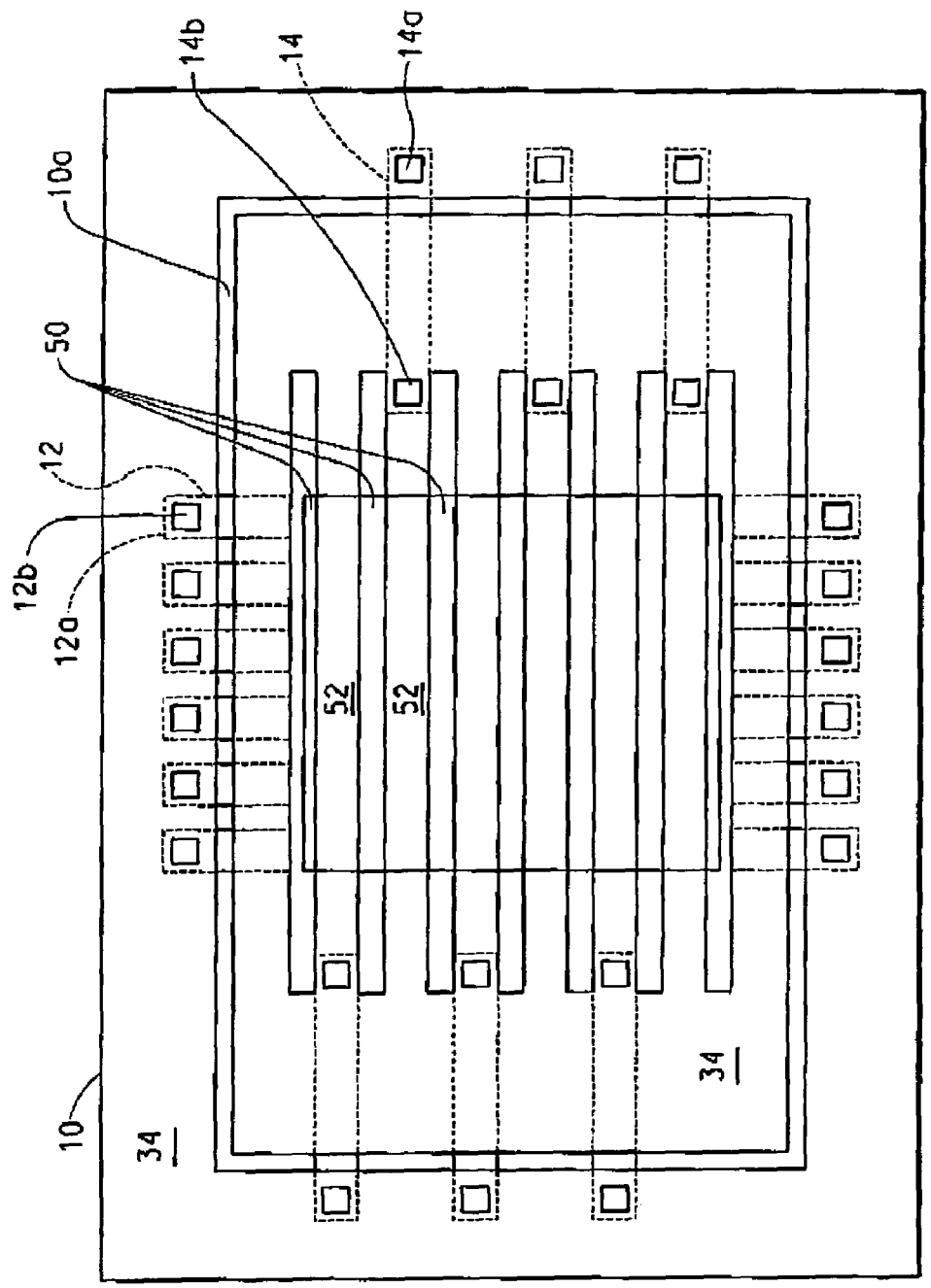
FIG. 10 is a of the structure of FIG 7. after laser ablation is used to selectively remove portions of the hole-transport and organic active layers.

Conductive bridge material may be formed next using a second shadow mask 60 as shown in FIG. 10. Second mask 60 is the same as first mask 40, except that mask 60 has a central opening 62 formed in the solid material 64 that is longer (in the direction parallel to the cathode separator strips 22) than the cathode opening 42 of first mask 40. When second shadow mask 60 is placed over the structure, the added length of the central opening 62 leaves exposed the central area of the array extending out to and including conductive lead via areas 14b. The width of opening 62, in the direction perpendicular to the cathode separator strips 22, may be substantially the same or narrower than opening 42. The solid material 64 is used to substantially prevent any bridge material from being deposited over portions of the substrate 10 that could lead to electrical shorting.

Figure 11A:
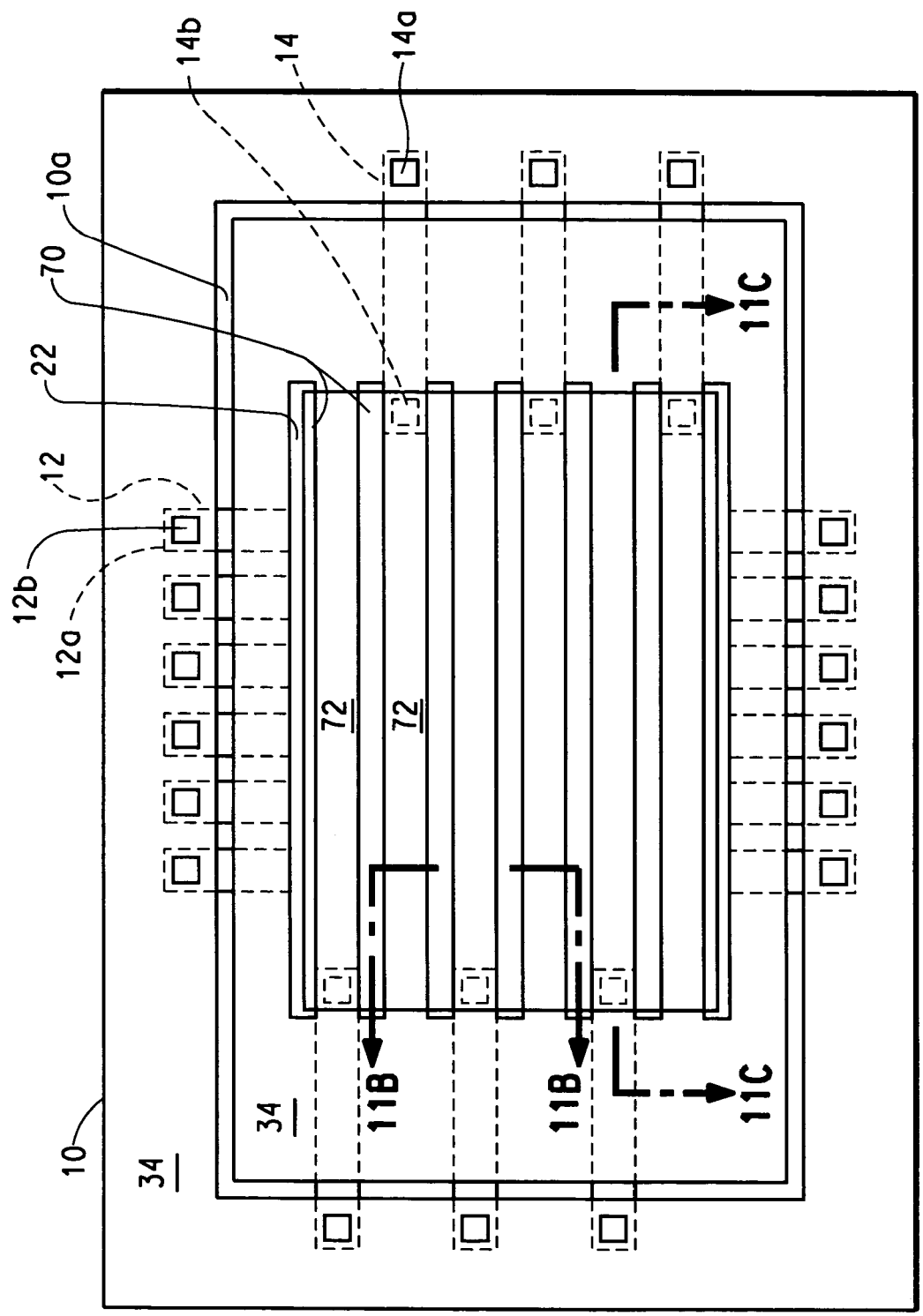
FIG. 11A is a plan view of the structure of FIG. 10, after forming the bridge material thereon.
Figure 11B:
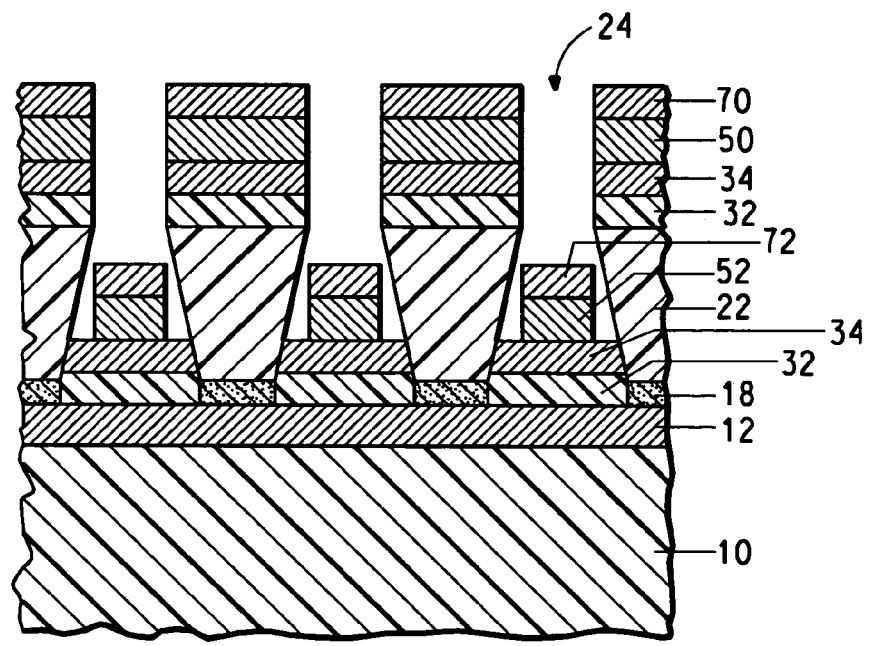
FIG. 11B is a cross-sectional view of the structure of FIG. 11A at sectioning lines 11B—11B.
Figure 11C:
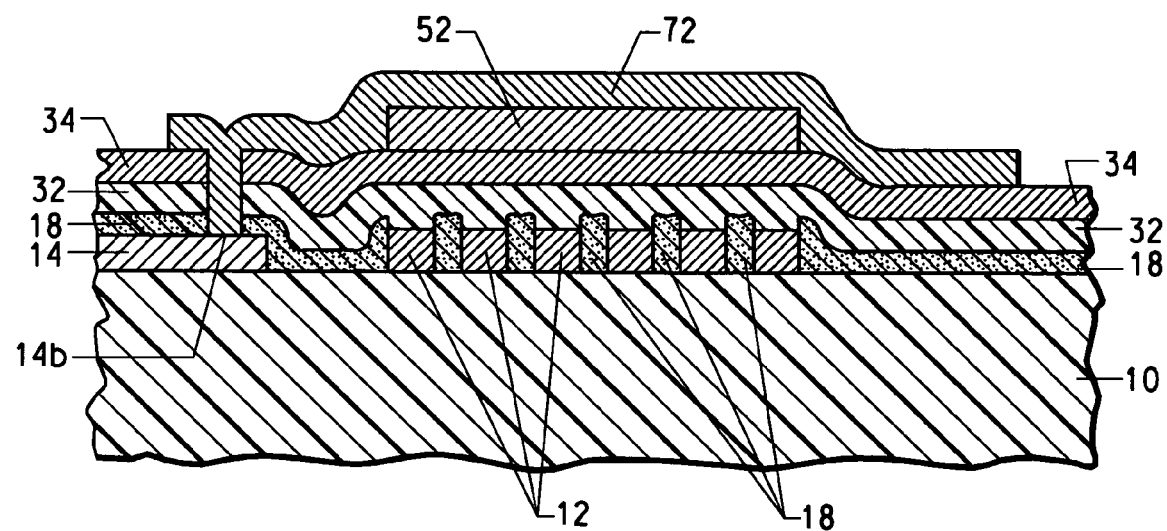
FIG. 11C is a cross-sectional view of the structure of FIG. 11A at sectioning lines 11C—11C.

After the second mask 60 is aligned to the substrate 10, the conductive bridge material is deposited over the structure portion(s) exposed by central opening 62 using physical vapor deposition (e.g., evaporation, sputtering, or the like), resulting in elongated conductive members 70 overlying conductive members 50 (over cathode separation strips 22), and conductive bridge members 72 that overlay cathode members 52 (in openings 24), as shown in FIGS. 11A, 11B and 11C. Due to the directional nature of the physical vapor deposition and the shape of the cathode separation strips 22, conductive bridge members 72 are not electrically connected to one another or to conductive members 70. If the walls of the cathode separation strips 22 become closer to vertical, an optional collimator may be used during deposition to reduce the likelihood of an unintended electrical short between any of the conductive bridge members 72 and the conductive members 70.

The conductive bridge material can be formed of any appropriate conductive material, preferably a metal-containing layer having a work function higher than that for the cathode members 52. For example, conductive bridge members 72 may be made of aluminum, copper, gold, and the like, with a thickness in the range of approximately 100–300 nm.

As shown in FIGS. 11A–11C, the conductive bridge members 72 lie between the cathode separation strips 22, while conductive members 70 overlie the cathode separation strips 22. Each conductive bridge member 72 is formed over one of the cathode members 52, and extends out and over the end of one of the conductive leads 14, making electrical contact therewith at the exposed conductive lead via area 14b. Therefore, conductive bridge members 72 form conductive bridges that electrically connect and contact the cathode members 52 and conductive leads 14. Wires or other conductive members are eventually formed in a conventional manner to electrically connect bonding pad areas 12b and 14a to the periphery/remote circuitry.

Other circuitry not illustrated in FIGS. 1–11C may be formed using any number of the previously described or additional layers. Although not shown, additional insulating layer(s) and interconnect level(s) may be formed to allow for circuitry in peripheral areas (not shown) that may lie outside the array. Such circuitry may include row or column decoders, strobes (e.g., row array strobe, column array strobe, or the like), sense amplifiers, or the like.

An encapsulating layer (not shown) can be formed over the array (and possibly over the peripheral and remote circuitry) to form a substantially completed electrical component, such as an electronic display, a radiation detector, a voltaic cell, and the like. The encapsulating layer may be attached at the rail portion 10b such that no organic layers lie between it and the substrate 10, thereby sealing the array portion of the device. Preferably, only end portions of the conductive leads 14 and anode leads 12a extend from the encapsulating layer so that electrical connections can be made with wire bonding pad areas 12b and 14a. Radiation may be transmitted through the encapsulating layer. If so, the encapsulating layer should be transparent to the radiation.

In another set of embodiments, a full-color active matrix display may be formed. An insulating layer of organic well structures may be sequentially formed after forming the anode strips 12 and conductive leads 14. Also, portions of the organic layer 34 may selectively receive organic dye(s) using a precision deposition technique to allow the different colors within a pixel to be realized. For active matrix arrays, the cathode separation strips 22 would not be formed, as a common cathode may be. If an active matrix OLED display is being formed, thin-film circuits may be present with substrate 10. Such thin-film circuits are conventional.

In one embodiment, a multi-colored or full-color passive matrix display may be formed. Six subpixels of two interleaved pixels may be formed with a structure similar to that shown in FIGS. 1–11C except additional layer previously described. For example, referring to FIG. 1, the first and fourth anode strips 12 may correspond to blue subpixels in different pixels, the second and fifth anode strips 12 may correspond to green subpixels in those different pixels, and the third and sixth anode strips 12 may correspond to red subpixels in those different pixels.

In still other embodiments, the anode and cathode can be reversed. A high work function material can be formed corresponding to the members 52. Another conductive material may be formed and correspond to the conductive members 70 and 72 seen in FIGS. 11A–11C.

Each pixel is defined by the area in which a first electrode (anode strip 12) and a second electrode (cathode member 52) vertically overlap (intersect). During operation of a display, appropriate potentials are placed on the anode strips 12 and the cathode members 52 (via conductive leads 14) to cause radiation to be emitted from the organic active layer 34 therebetween. More specifically, when light is to be emitted, a potential difference typically between 5 and 12 volts is applied between the appropriate anode strip(s) 12 and cathode member(s) 52. Holes are injected into the organic active layer 34 by the conductive anode strips 12 via hole-transport layer 32, and electrons are injected into the organic active layer 34 by the cathode members 52. When electron-hole pairs combine within the organic active layer 34, light or other radiation is emitted from the electronic device. In a display, rows and columns can be given signals to activate the appropriate pixels (electronic devices) to render a display to a viewer in a human-understandable form.

During operation of a radiation detector, such as a photodetector, sense amplifiers may be coupled to the conductive members of the array along the rows or columns. A potential may be maintained between the cathode members 52 and the anode strips 12 to allow better current flow to and from the electronic device to peripheral circuitry, however, such potential difference may not be sufficient to allow for the flow of current through the electronic device. In one non-limiting example, a potential difference in a range of approximately 0.5 to 1.5 V may be maintained across the organic active layer 34 during the operation of a detector. A relatively small amount of current may flow through the organic active layer 34. When radiated by light or another radiation source, sufficient energy may be received by the organic active layer 34 to significantly increase the number of electrons and holes within the organic active layer 34 and substantially increase the flow of current through the electronic device.

The sense amplifiers may be used to determine the current, and other peripheral (within the same component) or remote (not within the same component) circuitry can be used to interpret the information from the amount of current increase. This information may be in a digital or analog form. Such information may be used to create derivative information, such as imaging maps or other visual information. If the detector is designed to be sensitive to infrared radiation, an array of radiation detectors can be used to map temperature differences across the surface of the detector or temperature differences between objects spaced apart from the detectors. Alternatively, such a detector can be used to detect the presence of a flame (light or infrared radiation) for a fire alarm, to determine ultraviolet radiation intensity from sunlight passing through relatively thin stratus clouds, and the like.

In a voltaic cell, such as a photovoltaic cell, light or other radiation can be converted to energy that can flow without an external energy source. Whether using external power sources and the specific potentials used depends on the particular application of the electronic device. Skilled artisans are capable of designing the electronic devices, peripheral circuitry, and potentially remote circuitry, to best suit their particular needs.

Embodiments described above have benefits compared to conventional techniques. Protective layer 18 protects anode strips 12, conductive leads 14 and any barrier layer on substrate 10 from the laser ablation process, which can crack or otherwise damage such strips, leads and layers. Protective layer 18 also protects the anode strips 12 and conductive leads 14 from corrosion, providing better device yield and manufacturability without compromising device performance. Cracking of leads as seen with over-ablation during laser ablation should be substantially eliminated. Organic layers at the periphery of the device can allow for a diffusion path in the film plane for moisture to ingress under the encapsulating lid from the environment, thereby exposing the pixels to moisture, which can destroy the device in a matter of minutes. With the present invention, all of the organic material is safely removed from the rail portion of the substrate by laser ablation, because any barrier layer portions adjacent the rail portion are protected from the laser energy by protective layer 18.

Unlike a conventional method, conductive leads 14 are fabricated before the cathode members 52. In one embodiment described herein, the surfaces of the conductive lead via areas 14b may be cleaned before the conductive bridge members 72 are formed. Reduced contact resistance may be achieved resulting in better device performance.

Embodiments described herein may improve device lifetime and electrical characteristics due to the elimination of organic material between the anode strips 12. Specifically, with the present invention, most if not all of the space between the anode strips 12 is filled with the protective layer 18, instead of organic materials, which can act as reservoirs of moisture that release over time to cause pixel shrinkage. The storage life of a device is reduced by moisture attacking the pixel edges where they contact the anode strips. By avoiding the formation of organic materials between the anode strips 12, this source of potential pixel shrinkage can be avoided. The elimination of polymer material between anode strips 12 can also reduce cross-talk between pixels, which can be a problem with spin-on organic electronic devices.

It is to be understood that the present invention is not limited to the embodiment(s) described above and illustrated herein, but encompasses any and all variations falling within the scope of the appended claims. For example, materials, processes and numerical examples described above are exemplary only, and should not be deemed to limit the claims in any way. A single layer of material could be formed as more than one layer of like or similar materials, and vice versa. Any benefits, advantages, solutions to problems, and any element(s) that may cause any benefit, advantage, or solution to occur or become more pronounced disclosed above are not to be construed as a critical, required, or essential feature or element of any or all the claims.

What is claimed is:

1. An electronic device, comprising:
    at least one first electrode disposed over a substrate;
    at least one conductive lead disposed over the substrate and laterally spaced apart from the at least one first electrode;
    a protective layer of material selectively disposed over the at least one first electrode and the at least one conductive lead, wherein:
        the protective layer is not disposed over one or more selected portions of the at least one first electrode and the at least one conductive lead; and
        the protective layer is disposed over all non-selected portions of the at least one first electrode and the at least one conductive lead;
    organic active material selectively disposed over the protective layer, wherein the organic active material is not disposed over at least part of the one or more selected portions; and
    at least one second electrode disposed over the organic material.

2. The device of claim 1, wherein the one or more selected portions include at least one portion of the at least one first electrode and at least one portion of the at least one conductive lead.

3. The device of claim 1, wherein the at least one first electrode includes a pixel portion and an anode lead portion, wherein the anode lead portion further comprises a wire bonding pad area.

4. The device of claim 3, wherein the one or more selected portions includes the pixel portion, the wire bonding pad area, or combinations thereof.

5. The device of claim 1, wherein the protective layer and the organic material are not disposed over a selected portion of the substrate.

6. The device of claim 1, wherein the substrate is selected from a plastic substrate, a ceramic substrate, a glass substrate, a metal substrate, or combinations thereof.

7. The device of claim 3, wherein at least a portion of the at least one second electrode overlies the at least one first electrode pixel portion and is separated therefrom by at least a portion of the organic material to form a pixel of the electronic device.

8. The device of claim 1, wherein the device is selected from a light-emitting diode, a light-emitting diode display, a diode laser, a photodetector, a photoconductive cell, a photoresistor, a photoswitch, a phototransistor, a phototube, and IR detector, a photovoltaic device, a solar cell, a transistor, or a diode.

9. The device of claim 1, further comprising:

at least one conductive bridge member extending between and electrically connecting the at least one second electrode and the one or more selected portions of the at least one conductive lead.

* * * * *